(12) United States Patent
Zhou et al.

(10) Patent No.: US 12,422,488 B2
(45) Date of Patent: Sep. 23, 2025

(54) CALIBRATION OF CIRCUITRY PARAMETERS FOR CURRENT SENSING

(71) Applicant: TEXAS INSTRUMENTS INCORPORATED, Dallas, TX (US)

(72) Inventors: Yicheng Zhou, Shanghai (CN); Xiaodong Li, Shanghai (CN); Kangcheng Xu, Shanghai (CN)

(73) Assignee: Texas Instruments Incorporated, Dallas, TX (US)

( * ) Notice: Subject to any disclaimer, the term of this patent is extended or adjusted under 35 U.S.C. 154(b) by 218 days.

(21) Appl. No.: 18/307,934

(22) Filed: Apr. 27, 2023

(65) Prior Publication Data

US 2024/0319280 A1  Sep. 26, 2024

Related U.S. Application Data

(60) Provisional application No. 63/453,801, filed on Mar. 22, 2023.

(51) Int. Cl.
*G01R 31/374* (2019.01)
*G01R 31/3842* (2019.01)
*G01R 35/00* (2006.01)
*H03M 1/12* (2006.01)
*H02J 7/00* (2006.01)

(52) U.S. Cl.
CPC ....... *G01R 31/374* (2019.01); *G01R 31/3842* (2019.01); *G01R 35/005* (2013.01); *H03M 1/1245* (2013.01); *H02J 7/0048* (2020.01)

(58) Field of Classification Search
None
See application file for complete search history.

(56) References Cited

U.S. PATENT DOCUMENTS

2011/0298473 A1 * 12/2011 Irmer ................. G01R 19/0092
324/601

* cited by examiner

*Primary Examiner* — Jas A Sanghera
(74) *Attorney, Agent, or Firm* — Xianghui Huang; Frank D. Cimino

(57) ABSTRACT

Various examples disclosed herein relate to current sensing via current sensing circuitry, and more particularly, to calibrating current sensing circuitry to dynamically detect current ranges across a load. In an example embodiment, a microcontroller unit (MCU) is provided herein that includes a processor and current sensing circuitry coupled to the processor. The current sensing circuitry of the MCU is configured to measure voltages associated with a load. The processor of the MCU is configured to obtain the measured voltages from the current sensing circuitry, identify a temperature drift of the current sensing circuitry that exceeds a threshold value, update parameters with which to determine a current associated with the load based on the temperature drift, and determine the current associated with the load based on the updated parameters and the measured voltages.

20 Claims, 5 Drawing Sheets

CALIBRATION OF CIRCUITRY PARAMETERS FOR CURRENT SENSING

CROSS-REFERENCE TO RELATED APPLICATIONS

This application claims priority to and the benefit of U.S. Patent Application No. 63/453,801, filed Mar. 22, 2023, which is incorporated by reference herein in its entirety.

TECHNICAL FIELD

This relates generally to current sensing circuitry, and more particularly, to sensing dynamic current ranges based on parameters of current sensing circuitry.

BACKGROUND

Current detection solutions are commonly used in a wide range of electronic applications including measuring battery capacity and ensuring proper charging and discharging of a battery. For example, systems that utilize batteries, such as battery management systems, motor control systems, and even smaller-scale electronic systems, including mobile phones, laptops, and other portable electronics powered by batteries can employ current detection solutions. In these systems, both positive and negative currents coming from and going to a battery, respectively, can be measured.

An example of an existing current detection solution includes the use of discrete operational amplifiers and a successive approximation (SAR) analog-to-digital converter (ADC). In this solution, an operational amplifier can act as a buffer for a bias voltage while another operational amplifier can provide gain for the circuit. Another example of an existing current detection solution includes the use of an integrated analog front-end (AFE) device and a SAR ADC. A third example of an existing current detection solution includes the use of a Sigma-Delta (SD) ADC of a microcontroller unit (MCU) to detect current directly from a battery across a shunt resistor.

These conventional solutions for detecting bidirectional current suffer from several issues. First, the current ranges that these solutions can detect are limited by the shunt resistor, fixed resistor values of high-precision resistors, and the ADC voltage input range of the solution. Thus, if a user wants to detect a high current, the value of the shunt resistor may be decreased, which may introduce large error at low currents. Further, decreasing the shunt resistor value may negatively affect current accumulation accuracy over time. With respect to the first two solutions mentioned, these solutions also suffer from temperature drift issues, because they include discrete, external operational amplifiers, which generate heat, cause fluctuations to circuitry component values, and ultimately, produce error in current detection accuracy. The third solution that uses a Sigma-Delta ADC eliminates some of these issues, but such solutions are expensive due to additional cost for increased chip size.

SUMMARY

Disclosed herein are improvements to current sensing circuitry and calibration thereof. Current sensing refers to a technique used to measure electrical current of a power source, such as a battery. Various techniques can include sensing both positive and negative current coming from and going to the battery, respectively. This allows a system to identify a remaining capacity of the battery, or in other words, how much charge the battery has at a given time. For example, a system disclosed herein can perform current sensing by using high-precision operational amplifiers of a microcontroller unit (MCU) to generate dynamic bias voltage and flexible internal gain to detect load current of dynamic ranges across a shunt resistor. Unlike traditional current sensing solutions, such internal operational amplifiers, with respect to a MCU, can be calibrated to account for temperature drift, fluctuating resistor values, and the like, to detect load current according to different current conditions.

In an example embodiment, a circuit device includes a controller, a first resistor, a second resistor, and a filter. The controller includes a digital-to-analog converter, a first amplifier comprising an input coupled to the digital-to-analog converter and an output, a gain resistor network, a second amplifier comprising a first input, a second input, and an output, the first input and the output each coupled to the gain resistor network, and an analog-to-digital converter. The first resistor coupled between the output of the first amplifier and the second input of the second amplifier. The second resistor coupled to the second input of the second amplifier and configured to be coupled to a circuit having a current to be detected. The filter is coupled between the output of the second amplifier and the analog-to-digital converter.

This Summary is provided to introduce a selection of concepts in a simplified form that are further described below in the Detailed Description. It may be understood that this Summary is not intended to identify key features or essential features of the claimed subject matter, nor is it intended to be used to limit the scope of the claimed subject matter.

BRIEF DESCRIPTION OF THE DRAWINGS

The drawings are not necessarily drawn to scale. In the drawings, like reference numerals designate corresponding parts throughout the several views. In some examples, components or operations may be separated into different blocks or may be combined into a single block.

DETAILED DESCRIPTION

Figure 1:
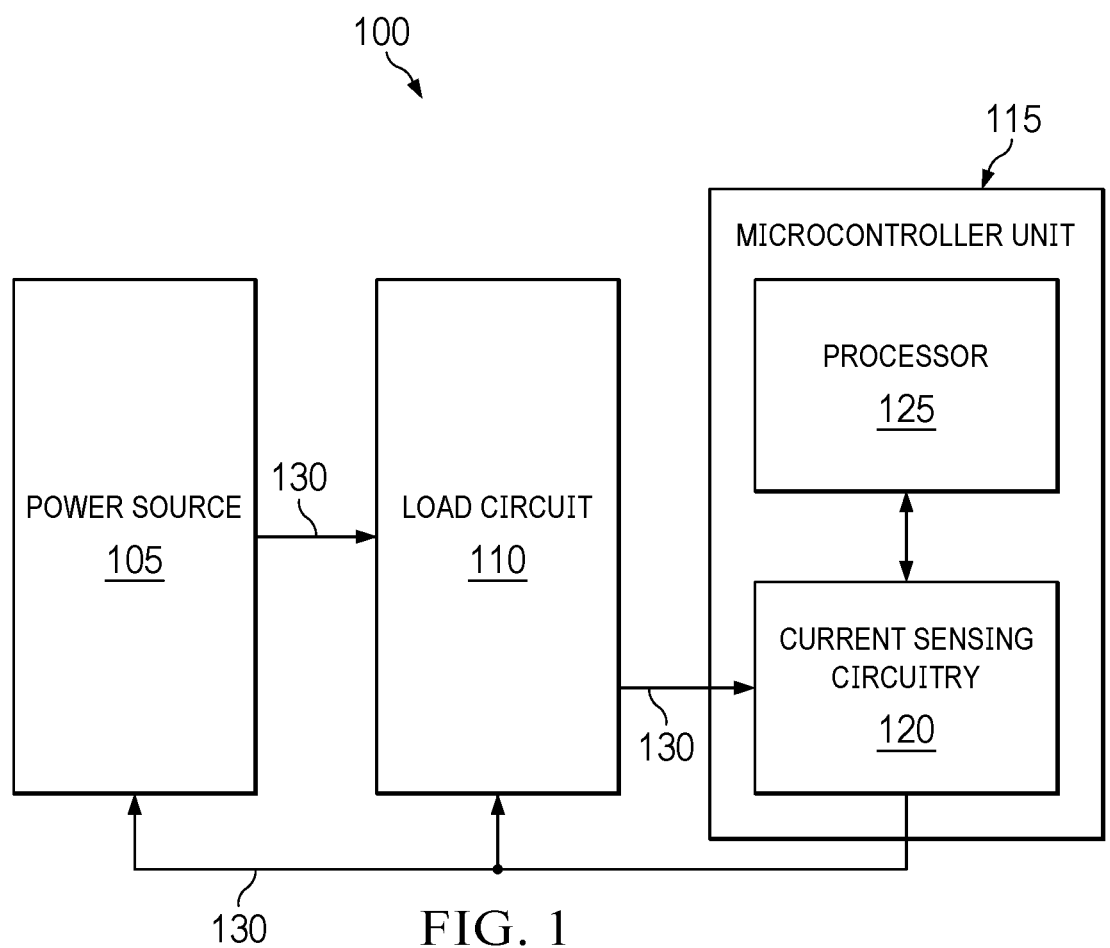
FIG. 1 illustrates an example operating environment configurable to perform current sensing calibration processes in an implementation.

Discussed herein are enhanced components, techniques, and systems related to current sensing. Current sensing refers to a technique used to measure electrical current of a power source, such as a battery. Current sensing circuitry can be used for detection of positive and negative current coming from and going to the battery, which can indicate the remaining capacity of the battery at a given time. In traditional current sensing systems, expensive circuitry and high-precision resistors are used to measure such currents. The detectable current range is fixed in such solutions, so high-precision resistors are often used to improve accuracy of current detection as the resistor values of such resistors is known to a high degree. However, despite the use of high-precision resistors, traditional current sensing systems suffer from temperature drift, or increases in temperature, which can cause inaccuracies in current detection regardless of the tolerance of the resistors.

A current sensing system, such as one described herein, can utilize cost-effective resistors and operational amplifiers, among other components, internal to a microcontroller unit (MCU). The proposed architecture can provide variable and flexible parameters to accurately detect current of a power source despite temperature drift or other electrical issues. For example, the gain of an operational amplifier can be adjusted if the detected current exceeds a first threshold (e.g., the top of an analog-to-digital converter (ADC) range). If so, the current sensing system can switch one or more operational amplifiers to a high gain setting. If the detected current is under a second threshold, however, the current sensing system can switch one or more operational amplifiers to a low gain setting. Accordingly, parameters of the current sensing system can be re-calibrated if temperature drift causes the current sensing system to read the detected current inaccurately. Advantageously, the disclosed current sensing system can reduce costs for users and reduce current sensing error contributed by operational amplifiers and resistors due to temperature drift.

One example embodiment includes a circuit device. The circuit device includes a controller, a first resistor, a second resistor, and a filter. The controller includes a digital-to-analog converter, a first amplifier comprising an input coupled to the digital-to-analog converter and an output, a gain resistor network, a second amplifier comprising a first input, a second input, and an output, the first input and the output each coupled to the gain resistor network, and an analog-to-digital converter. The first resistor coupled between the output of the first amplifier and the second input of the second amplifier. The second resistor coupled to the second input of the second amplifier and configured to be coupled to a circuit having a current to be detected. The filter is coupled between the output of the second amplifier and the analog-to-digital converter.

Another example embodiment includes a microcontroller unit (MCU). The MCU includes a processor and current sensing circuitry coupled to the processor. In an example embodiment, a microcontroller unit (MCU) is provided herein that includes a processor and current sensing circuitry coupled to the processor. The current sensing circuitry of the MCU is configured to measure voltages associated with a load. The processor of the MCU is configured to obtain the measured voltages from the current sensing circuitry, identify a temperature drift of the current sensing circuitry that exceeds a threshold value, update parameters with which to determine a current associated with the load based on the temperature drift, and determine the current associated with the load based on the updated parameters and the measured voltages.

In yet another example, a method is provided. The method includes identifying a temperature drift of current sensing circuitry configured to measure voltages associated with a load and obtaining the measured voltages from the current sensing circuitry. Based on the temperature drift, the method further includes updating parameters with which to determine a current associated with the load and determining the current associated with the load based on the updated parameters and the measured voltages.

FIG. 1 illustrates an example operating environment configurable to perform current sensing calibration processes in an implementation. FIG. 1 shows operating environment 100, which includes load circuit 110 and microcontroller unit (MCU) 115. Load circuit 110 is fed current from power source 105 and provides the current to MCU 115. MCU 115 includes current sensing circuitry 120 and processor 125. Processor 125 can be configured to operate current sensing calibration processes, such as process 200 of FIG. 2.

Power source 105 is representative of a battery or another source of power that provides current 130 to load circuit 110. In various examples, power source 105 includes a battery, and load circuit 110 and MCU 115 can be configured to measure current 130 coming from (i.e., positive charge) and going to (i.e., negative charge) the battery. The battery has a capacity (i.e., an amount of charge). By measuring positive and negative currents of the battery, a user can detect the amount of capacity remaining of the battery, among other metrics.

Load circuit 110 includes various electrical components, such as resistors, capacitors, and traces configured to provide a conductive path from power source 105 to a load and to MCU 115. Of the electrical components, load circuit 110 may include a shunt resistor that provides a voltage drop at which current sensing circuitry 120 can measure current 130. In various examples, the shunt resistor has a fixed value selected based on power source 105, parameters of MCU 115 and components thereof, and a desired range and measurement accuracy of current 130.

MCU 115 includes current sensing circuitry 120 and processor 125, which are configured to obtain current 130 from load circuit 110 and pass current 130 through electrical components of current sensing circuitry 120 to measure current 130. Current sensing circuitry 120 includes resistors, operational amplifiers, an analog-to-digital converter (ADC), a digital-to-analog converter (DAC), and a temperature sensor, each of which may be located internally with respect to MCU 115. In operation, components of current sensing circuitry 120 can be configured with parameters. Examples of such parameters may include gain and bias settings for the operational amplifiers, resistor values of the resistors, and output voltages of current sensing circuitry 120, among other settings. The parameters for some components may be pre-configured and/or fixed, while the parameters for other components may be configurable by processor 125. These parameters can be used, at least in part, by processor 125 to calculate current 130.

Processor 125 is representative of one or more processors (e.g., central processing units (CPUs)), processor cores, or microprocessors capable of executing program instructions of software and/or firmware to enable current sensing calibration techniques described herein. In some cases where processor 125 includes multiple processors, the processors can be implemented in an integrated manner, however, in other cases, the processors can be implemented separately with respect to each other.

During run-time performance of the components of operation environment 100, processor 125 can be configured to calibrate parameters associated with components of current sensing circuitry 120 to ensure accuracy when measuring current 130. To begin a calibration process, in one example, processor 125 can obtain a signal from a temperature sensor of current sensing circuitry 120 that indicates that the temperature of current sensing circuitry 120 has exceeded a threshold value. The temperature sensor can monitor the temperature of current sensing circuitry 120 over time, and upon the temperature drifting (i.e., increasing or decreasing an amount) beyond the threshold value, the temperature sensor can provide an indication to processor 125. In some cases, the threshold value can be pre-configured based on the components of load circuit 110, current sensing circuitry 120, and a desired accuracy when reading current 130.

In another example, the ADC of current sensing circuitry 120 can provide digital signals representative of electrical values (e.g., voltage, current) to processor 125. Processor 125 can determine whether the electrical values have fluctuated due to a rise or fall in temperature of current sensing circuitry 120. For example, a change in voltage from one value to another value from the start of a performance to a current time may indicate that the temperature of current sensing circuitry 120 has increased or decreased. Often, the output values of components of current sensing circuitry 120 can change due to increases in temperature, which may decrease the accuracy when measuring current 130.

Based on the temperature drift, and the amount of the temperature drift (i.e., an amount of increase or decrease in temperature), processor 125 can update the parameters associated with the components of current sensing circuitry 120. In various examples, processor 125 can perform computations or logic using the parameters and measured voltages from various points of current sensing circuitry 120 (e.g., voltages at terminals of the ADC) to calculate current 130. As the temperature of current sensing circuitry 120 changes, processor 125 may inaccurately compute current 130. Updating these parameters may entail changing the values of some or all of the parameters in the logic, based on the temperature drift, to compensate for the temperature drift and to accurately measure current 130.

Processor 125 can then obtain a reading of current 130 using the updated parameters and the measured voltages of current sensing circuitry 120. Processor 125 may iteratively perform computations to calculate current 130 periodically, and thus, processor 125 may perform calibration techniques described above to continually ensure accurate results when performing such computations.

In some cases, processor 125 may update the parameters using pre-configured groups of parameters. For example, based on an amount of temperature drift, processor 125 can determine that an amount of gain is required to compensate for the amount of temperature drift. Accordingly, processor 125 can update the parameters with which to compute current 130 using a first set of pre-configured parameters. Subsequently, based on a further increase in temperature, processor 125 may determine that a further amount of gain is required to compensate for the further amount of temperature drift. Processor 125 can update the parameters again using a second set of pre-configured parameters. In such cases, any number, combination, or variation of parameters can be associated with an amount of temperature drift for calibration purposes.

In other examples, processor 125 may update physical parameters of the components of current sensing circuitry 120. This may include updating output values of resistors, gain or bias of an operational amplifier, and the like. To do so, processor 125 can provide the updated parameters to the DAC of current sensing circuitry 120. This may entail providing digital signals to the DAC representative of the new parameters. The DAC can convert the digital signals to analog signals readable by components of current sensing circuitry 120 and provide the analog signals to the operational amplifiers of current sensing circuitry 120. The analog signals may include one or more settings for the operational amplifiers to function. The operational amplifiers can perform according to the new parameters to output different electrical values, which in turn, increases accuracy when processor 125 measures current 130.

Figure 2:
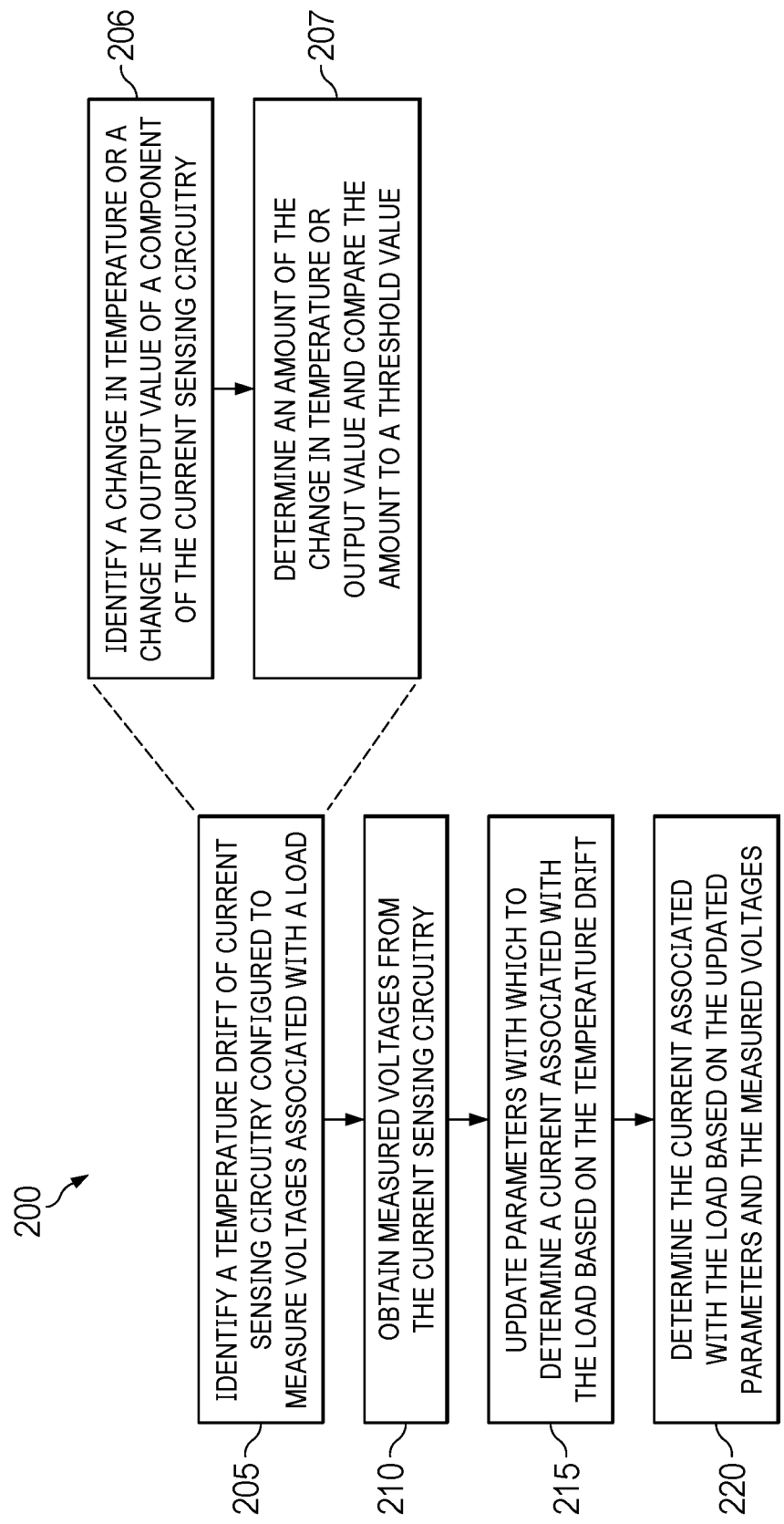
FIG. 2 illustrates a series of steps for calibrating current sensing circuitry of a battery management system in an implementation.

FIG. 2 illustrates a series of steps for calibrating current sensing circuitry of a battery management system in an implementation. FIG. 2 includes process 200 described below, which references elements of FIG. 1. Process 200 can be implemented on software, firmware, or hardware, or any combination or variation thereof. For example, process 200 can be included on software of one or more computer-readable storage media. Process 200 can be executed by one or more processors, such as processor 125 of operating environment 100 of FIG. 1.

In operation 205, processor 125 identifies a temperature drift of current sensing circuitry 120. Current sensing circuitry 120 includes various electrical components configured to receive current from power source 105, via load circuit 110, and measure voltages associated with a load at various points within current sensing circuitry 120. The voltages associated with the load may be driven by parameters of the electrical components of current sensing circuitry 120 (e.g., a gain setting, a bias setting, resistor settings). However, as the temperature of the electrical components of current sensing circuitry 120 (e.g., resistors, operational amplifiers) increases, the parameters and values measured at and/or by the electrical components of current sensing circuitry 120 may change.

For example, to identify the temperature increase or decrease (also referred to herein as temperature drift), processor 125, in operation 206, may identify a change in temperature or a change in output value of a component of current sensing circuitry 120 in operation 206. In some examples, current sensing circuitry 120 may include a temperature sensor. The temperature sensor can be configured to determine an amount of change in temperature by measuring temperatures of current sensing circuitry 120 at a given time, measure the temperatures at a later time, and compare the temperatures to determine an increase or decrease in temperature. When the temperature reaches or exceeds a threshold value, the temperature sensor can be configured to provide an indication thereof to processor 125. In other examples, processor 125 can determine a voltage drift of current sensing circuitry 120. Voltage drift refers to a change from an expected voltage of current sensing circuitry 120, when current sensing circuitry 120 is driven by the parameter, to a voltage different from the expected voltage. The amount of change in voltage can correlate to the amount of temperature drift of current sensing circuitry 120. Thus, processor 125, in operation 207, can determine the amount of voltage drift based on the difference between expected voltage and current voltage output by current sensing circuitry 120 and the amount of temperature drift based on the amount of voltage drift, and the processor 125 can compare the amount of temperature drift to a threshold in operation 207.

Next, in operation 210, processor 125 can obtain measure voltages from current sensing circuitry 120. The voltages can be measured at various terminals of an analog-to-digital converter (ADC) of current sensing circuitry 120. The ADC can convert the measurements of the voltages from analog data to digital data and provide digital representations of the voltages to processor 125.

In operation 215, processor 125 updates the parameters associated with the electrical components of current sensing circuitry 120 based on the temperature drift to determine current 130. To determine current 130, processor 125 can perform computations or logic using the parameters and measured voltages from various points of current sensing circuitry 120 (e.g., voltages at terminals of the ADC) to calculate current 130. As the temperature of current sensing circuitry 120 changes, processor 125 may inaccurately compute current 130. Updating these parameters may entail changing the values of some or all of the parameters in the logic, based on the temperature drift, to compensate for the temperature drift and to accurately output current 130.

Processor 125 can then, in operation 220, determine current 130 using the updated parameters and the measured voltages of current sensing circuitry 120. Processor 125 can repeat process 200 during run-time of load circuit 110 and current sensing circuitry 120 to iteratively calibrate the parameters associated with the electrical components of the circuits and ensure accuracy when measuring current 130 (i.e., the load current) within a desired accuracy.

Figure 3:
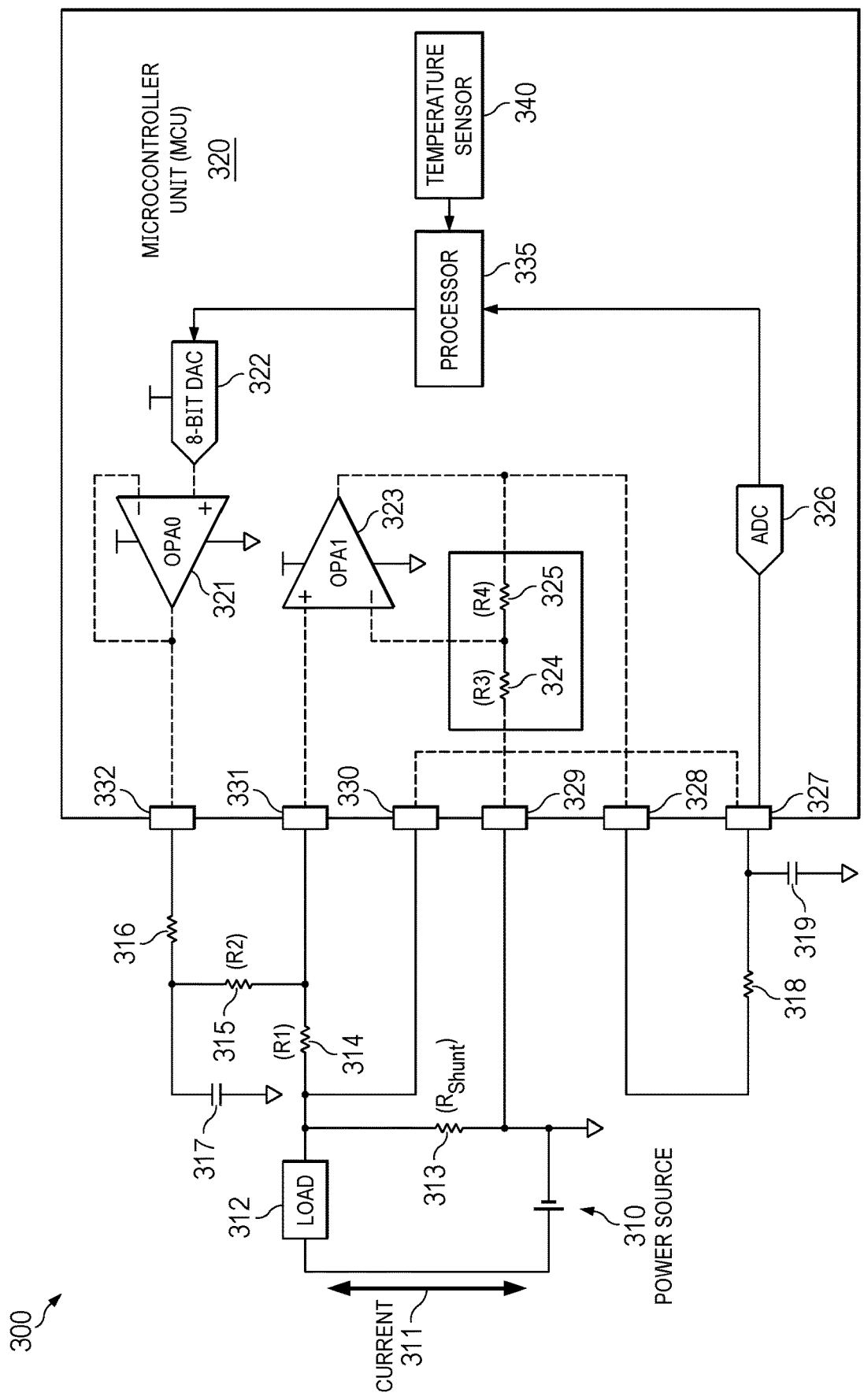
FIG. 3 illustrates an example battery management system in an implementation.

FIG. 3 illustrates an example battery management system in an implementation. FIG. 3 shows battery management system 300, which includes a power source 310, a load 312, a microcontroller unit (MCU) 320, and various circuit components. The MCU 320 may include a processing unit 335 that may implement current sensing calibration processes, such as process 200 of FIG. 2. The battery management system 300 may also include one or more temperature sensors 340 coupled to the processing unit 335. Some of the temperature sensors 340 may be internal to the MCU 320.

Power source 310, load 312, and shunt resistor 313 (denoted as $R_{Shunt}$) may be coupled in series in a circuit such that the power source 310 is coupled to a power input of the load and shunt resistor 313 is coupled between a power output of the load 312 and the power source 310. A first resistor 314 (denoted as R1) may include a first terminal coupled to the power output of the load 312, and a second resistor 315 (denoted as R2) may be coupled to a second terminal of the first resistor 314. A third resistor, resistor 316 may be coupled to a terminal of the second resistor 315 and to a terminal 332 of MCU 320. A first capacitor 317 can also be coupled to terminals of resistor 316 and the second resistor 315. A fourth resistor, resistor 318, can be coupled to terminals 327 and 328 of MCU 320. A second capacitor, capacitor 319, can be coupled to a terminal of the fourth resistor. Although resistors 314, 315, 316, and 318, and capacitors 317 and 319 are shown as external to the MCU 320, in some examples, one or more may be internal to the MCU 320.

Power source 310 is representative of a battery that can provide a current 311 to load 312 and other components of load circuit 305. Power source 310 can have a capacity, or an amount of charge, and changes in the amount of charge can be determined by measuring current 311 across shunt resistor 313.

Load 312 is representative of a device or system connected to power source 310. For example, load 312 may include devices that consume power such as processors, microcontrollers, storage devices, and/or peripherals and may include devices that provide power such as a charger configured to charge or, on occasion, discharge power source 310 depending on the remaining capacity of power source 310.

Shunt resistor 313 is a resistor that provides a voltage drop where a current or voltage value can be measured, such as current 130 of FIG. 1. First resistors 314 and second resistor 315 can function as a voltage divider between load circuit 305 and MCU 320. In various examples, shunt resistor 313, first resistor 314, and second resistor 315 have pre-configured, fixed values selected based on power source 310, load 312, and the desired detection range of current 311 and a measurement accuracy thereof.

MCU 320 includes processor 335, temperature sensor 340, and electrical components coupled to load 312 and sense a current, within a range of current, across shunt resistor 313. The electrical components of MCU 320 include an operational amplifier 321, 8-bit digital-to-analog converter 322 (referred to hereinafter as DAC 322), operational amplifier 323, gain resistors 324 and 325 (denoted as R3 and R4, respectively) that form a gain resistor network, and analog-to-digital converter (ADC) 326. MCU 320 can include several terminals, such as terminals 327, 328, 329, 330, 331, and 332, which serve as connection points within battery management system 300 such that ADC 326 can measure current through load 312. In that regard, ADC 326 may have a first channel coupled to terminal 327 and a second channel coupled to terminal 330. In various examples, the resistor values of gain resistors 324 and 325, the amount of gain of operational amplifiers 321 and 323, and the output voltages of operational amplifiers 321 and 323 (also collectively referred to herein as parameters) can be pre-configured prior to run-time (e.g., during manufacturing) or they can be calibrated or updated during run-time by processor 335. Regardless, the electrical components of MCU 320 can be configured to measure electrical values (e.g., voltage, current) across shunt resistor 313 (load current) and other points of circuitry based such parameters and sense the current within a desired range.

Processor 335 is representative of one or more processors (e.g., central processing units (CPUs)), processing cores, or microprocessors capable of executing program instructions of software and/or firmware to enable current sensing calibration techniques described herein. During run-time operation of battery management system 300, processor 335 receives digital signals from ADC 326 indicative of voltage measurements at the terminals of MCU 320, which are associated with the flow of current through load 312. Additionally, processor 335 receives indications of a temperature drift of the electrical components from temperature sensor 340. As the current flows through the electrical components, the temperature within battery management system 300 and/or MCU 320 may increase, and consequently, the voltage measurements provided to processor 335 may differ due to the temperature increase. Temperature sensor 340 may be configured to monitor the temperature of MCU 320, and components thereof, and based on the temperature reaching or exceeding a threshold value, temperature sensor 340 can provide an indication of temperature drift to processor 335.

In response to receiving the indication of temperature drift, processor 335 can be configured to update parameters with which to determine the current across shunt resistor 313. While processor 335 can detect the load current at any time, the temperature drift can cause value of resistors and operational amplifiers to change and thus, processor 335 may identify a value for the load current that is inaccurate compared to the true value of the load current. Therefore, processor 335 can employ calibration techniques described below to determine changed output voltages of operational amplifiers 321 and 323 and resistor values of resistors 314, 315, 324, and 325 (R1, R2, R3, and R4, respectively) and update logic or mathematical equations with new parameters to compensate for the effects of the temperature drift.

Processor 335 can first determine the output voltage of operational amplifier 323. The output voltage of operational amplifier 323, $V_o$, can be identified at terminal 327 of MCU 320 and can be defined using either of the following equations, where $V_{DAC+OP40}$ refers to the output voltage of operational amplifier 321, I refers to the current across shunt resistor 313, $R_S$ refers to the resistance of shunt resistor 313, and $V_{offset}$ refers to an offset voltage of operational amplifiers 323:

$$V_o = \left(\frac{V_{DAC+OPA0} - IR_S}{R_1 + R_2} * R_1 + IR_S\right)\left(1 + \frac{R_4}{R_3}\right) + V_{offset}$$

Or $$V_o = \left(\frac{R_1}{R_1 + R_2} V_{DAC+OPA0} + \frac{R_2}{R_1 + R_2} IR_S\right)\frac{R_3 + R_4}{R_3} + V_{offset}$$

Processor 335 can determine $V_{DAC+OPA0}$ by identifying the voltage at terminal 332 of MCU 320. Processor 335 can determine the ratio values of R1 and R2, resistors 314 and 315, by identifying voltages, or receiving indications of the voltages thereof, at terminals 330, 331, and 332 and performing an operation using the identified voltages. Processor 335 can determine the ratio values of R3 and R4, or gain resistors 324 and 325, by identifying voltages at terminals 327 and 331 and performing an operation using the identified voltages. More specifically, processor 335 can use the following equation to determine the ratio values of R3 and R4:

$$\frac{R_4 + R_3}{R_3} = \frac{V_{A3} - V_{OPA\,offset}}{\frac{R_1}{R_1 + R_2} * V_{A4}}$$

Where $V_{A3}$ corresponds to the voltage at terminal 327, $V_{A4}$ corresponds to the voltage at terminal 332, and $V_{OPAoffset}$ corresponds to the offset voltage of operational amplifier 321. Next, processor 335 can determine $V_{offset}$ when the output of operational amplifier 321 is directly connected to an input of operational amplifier 323 by identifying the voltages at terminals 327, 328, and 332 and performing an operation using the identified voltages. More specifically, processor 335, via a multiplexer, for example, can connect terminals 329 and 331 together to identify the voltages at terminals 327 and 329/331.

When the current across shunt resistor 313, I, is equal to 0, the voltage at terminal 327 of MCU 320 can be defined as $V_{ref}$ using the following equation:

$$V_{ref} = \frac{R_1}{R_1 + R_2} \frac{R_3 + R_4}{R_3} V_{DAC+OPA0} + V_{offset}$$

When the current across shunt resistor 313, I, is not equal to 0 (e.g., at run-time), the change in voltage, or $V_o$ minus $V_{ref}$, can be defined as:

$$V_o - V_{ref} = \frac{R_2}{R_1 + R_2} \frac{R_3 + R_4}{R_3} IR_S$$

Accordingly, processor 335 can calculate the current of battery management system 300 using the following equation:

$$I = \frac{V_o - V_{ref}}{R_S} \frac{R_3}{R_4 + R_3} \frac{R_1 + R_2}{R_2}$$

After identifying the current, output voltages, and resistor values, processor 335 can compare the values with expected values, or values the components should output based on the parameters of the components (i.e., before temperature drift). Depending on which values have changed or have been affected by temperature drift, processor 335 can update the values used in the above equations accordingly (e.g., $V_{DAC+OPA0}$, (R2/R1+R2), (R3+R4)/R3, $V_{offset}$), and re-calculate the current using different values. Importantly, by identifying ratios and relationships between the electrical components, processor 335 can perform calibration during run-time operation of load circuit 305 and MCU 320. For example, in one case, processor 335 can determine that operational amplifier 323 causes the error in current detection during run-time. This may be due to increased internal gain from the temperature drift. Accordingly, processor 335 can determine new parameters to influence the ratio between R3 and R4. In another case, processor 335 can determine that operational amplifier 321 causes the error by outputting a higher voltage due to temperature drift. In this case, processor 335 can determine new parameters to influence the output voltage of DAC 322 and/or operational amplifier 321. Several combinations and variations of issues and new parameters to resolve the issues can be contemplated but are not discussed here for the sake of brevity.

In some examples where processor 335 updates physical or actual settings of electrical components (e.g., operational amplifiers 321 and/or 323), processor 335 can then provide the new parameters to DAC 322 as digital signals. DAC 322 can convert the digital signals to analog signals and provide the analog signals as an input to operational amplifier 321. Operational amplifier 321 can operate using the new parameters and output a different voltage at terminal 332 of MCU 320. Accordingly, the voltage at terminal 331 connected to operational amplifier 323 can influence the operation of operational amplifier 323 and gain resistors 324 and 325, which can ultimately compensate for the temperature drift. Processor 335 can monitor the values at the terminals of MCU 320 periodically or continuously to perform calibration of the current sensing components and ensure that the components can accurately measure the current of battery management system 300.

Figure 4:
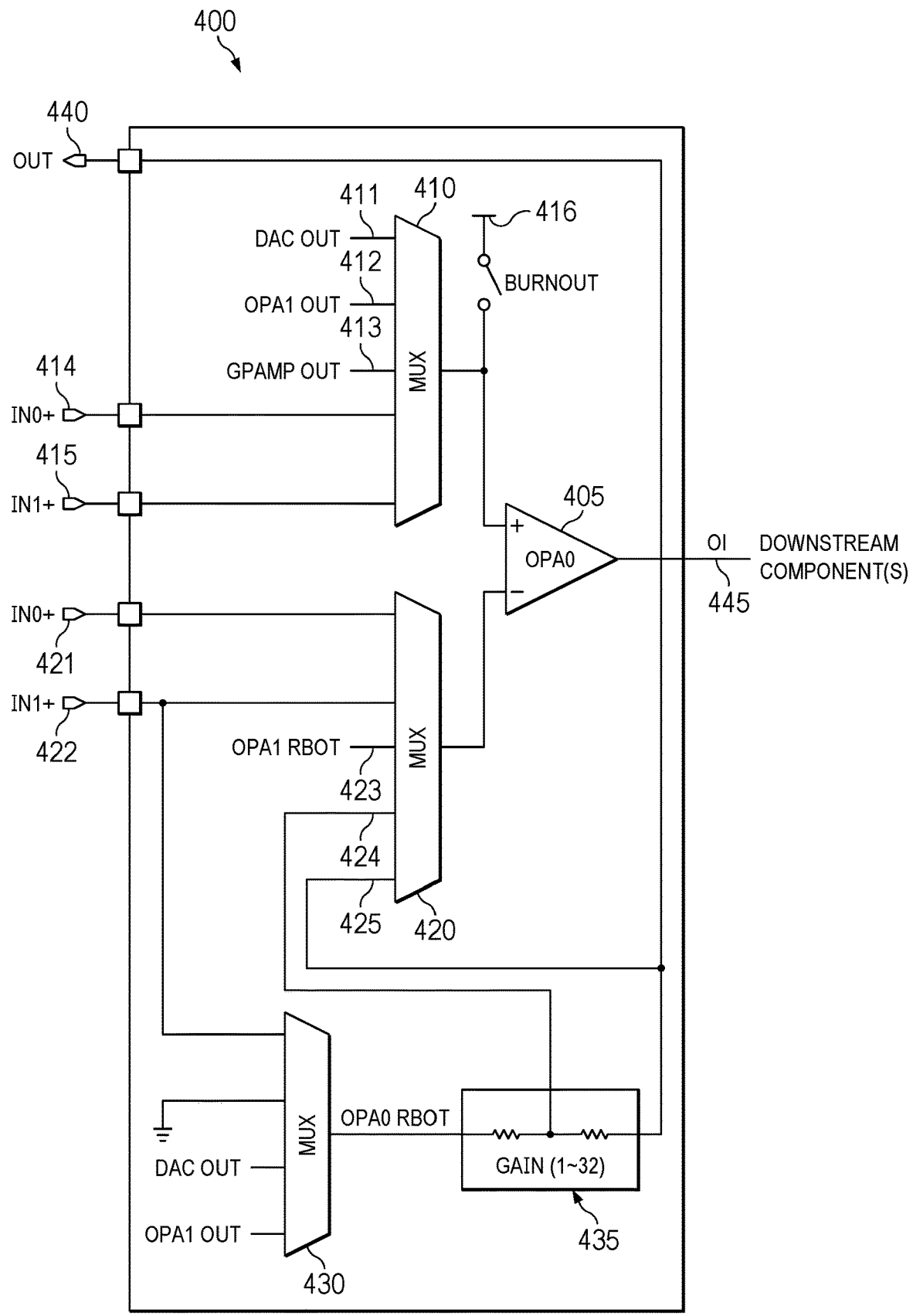
FIG. 4 illustrates an example schematic of a component of current sensing circuitry in an implementation.

FIG. 4 illustrates an example schematic of a component of current sensing circuitry in an implementation. FIG. 4 shows schematic 400, which demonstrates elements, inputs, and outputs of operational amplifier 405 of a current sensing unit. Operational amplifier 405 may be included in current sensing circuitry of a microcontroller unit and of a battery management system, such as current sensing unit 120 of MCU 115 of FIG. 1 and battery management system 300 of FIG. 3. For example, schematic 400 may represent the elements, inputs, and outputs of operational amplifiers 321 and/or 323 of FIG. 3.

Schematic 400 shows operational amplifier 405, which includes multiplexers (MUXs) 410 and 420 coupled to inputs of operational amplifier 405 and downstream component(s) 445 coupled to an output of operational amplifier 405.

MUX 410 includes five terminals, which can be selectively chosen by a processor, such as processor 335 of FIG. 3. Terminal 411 corresponds to an output of a digital-to-analog converter (e.g., DAC 322 of FIG. 3), terminal 412 corresponds to an output of another operational amplifier of a system, terminal 413 corresponds to an output of another operational amplifier of the system, and terminals 414 and 415 correspond to positive input channels, IN0+ and IN1+, respectively. MUX 410 can also be shorted to ground via burnout switch 416, such that the input of operational amplifier 405 can be grounded to reduce current detection error in various scenarios. Similarly, MUX 420 includes five terminals, which can also be selectively chosen by the processor. Terminals 421 and 422 correspond to positive input channels, IN0+ and IN1+, respectively, terminal 423 corresponds to an output of another operational amplifier of the system, and terminals 424 and 425 correspond to different points of gain block 435. A third multiplexer, MUX 420 can be included and coupled to terminal 422 of MUX 420 and to gain block 435. Gain block 435 can be included to provide a gain between 1 and 32 for operational amplifier 405, which can be fed as an input into operational amplifier 405 via terminals 424 or 425 or provided as output terminal 440 of operational amplifier 405.

The output of operational amplifier 405 can be fed to downstream component(s) 445. Downstream component(s) 445 may include an analog-to-digital converter, such as ADC 326 of FIG. 3, a further operational amplifier, a comparator, or another electrical component.

Figure 5:
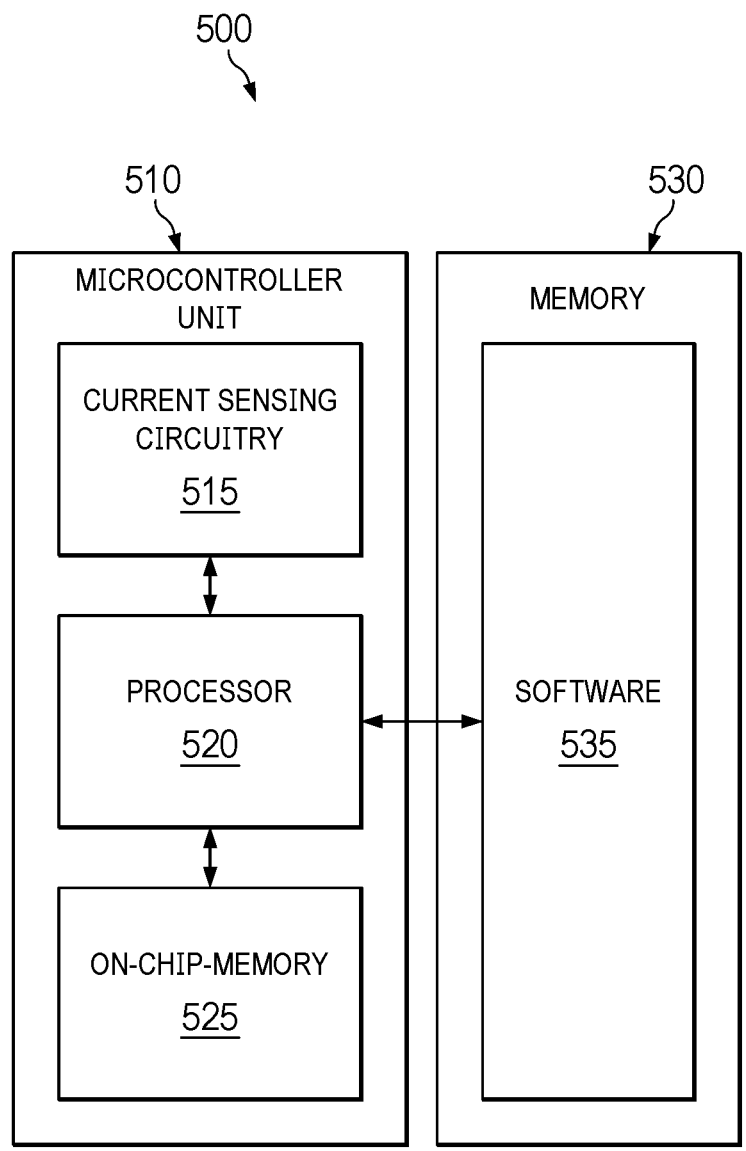
FIG. 5 illustrates an example operating environment for executing software that may be used in accordance with some examples of the present technology.

FIG. 5 illustrates an example operating environment for executing software in an implementation. FIG. 5 includes operating environment 500, which further includes microcontroller unit (MCU) 510 and memory 530. MCU 510 further includes current sensing circuitry 515, processor 520, and on-chip memory 525. Memory 530 further includes software 535 executable by processor 520.

MCU 510 is representative of a system or device with which the various operational architectures, processes, scenarios, and sequences disclosed herein for current sensing calibration may be employed. For example, MCU 510, current sensing circuitry 515 and processor 520 thereof are representative of MCU 115, current sensing circuitry 120, and processor 125 of FIG. 1.

Current sensing circuitry 515 includes various electrical components, such as resistors, operational amplifiers, a digital-to-analog converter, and an analog-to-digital converter, among other components. Processor 520 can measure electrical values at various points of the electrical components and use parameters of the electrical components to sense current of a load (not shown).

Processor 520 can load and execute software 535 stored on memory 530. Software 535 includes and implements current sensing calibration processes, such as process 200 of FIG. 2, which is representative of any of the calibration and current detection processes discussed with respect to the preceding Figures. When executed by processor 520 to provide calibration functions, software 535 directs processor 520 to operate as described herein for at least the various processes, operational scenarios, and sequences discussed in the foregoing implementations and examples.

Processor 520 may include a microprocessor and other circuitry that retrieves and executes software 535 from memory 530. Processor 520 may be implemented within a single processing device but may also be distributed across multiple processing devices or subsystems that cooperate in executing program instructions. Examples of processor 520 include general purpose central processing units, graphical processing units, application specific processors, and logic devices, as well as any other type of processing device, combinations, or variations thereof.

Memory 530 may include any computer readable storage media readable by processor 520 and capable of storing software 535. In some cases, software 535, or portions of software 535 may also be stored on on-chip memory 525. Like memory 530, on-chip memory may also include any computer readable storage media readable by processor 520.

Memory 530 and on-chip memory 525 may include volatile and nonvolatile, removable and non-removable media implemented in any method or technology for storage of information, such as computer readable instructions, data structures, program modules, or other data. Examples of storage media include random access memory, read only memory, magnetic disks, optical disks, optical media, flash memory, virtual memory and non-virtual memory, magnetic cassettes, magnetic tape, magnetic disk storage or other magnetic storage devices, or any other suitable storage media. In no case is the computer readable storage media a propagated signal.

In addition to computer readable storage media, in some implementations, memory 530 and on-chip memory 525 may also include computer readable communication media over which at least some of software 535 may be communicated internally or externally. Memory 530 may be implemented as a single storage device but may also be implemented across multiple storage devices or sub-systems co-located or distributed relative to each other. Memory 530 may include additional elements, such as a controller, capable of communicating with processor 520 or possibly other systems. Similarly, on-chip memory 525 may be implemented as a single storage device but may also be implemented across multiple storage devices or sub-systems co-located or distributed relative to each other. On-chip memory 525 may include additional elements, such as a controller, capable of communicating with processor 520 or possibly other systems.

Software 535 may be implemented in program instructions and among other functions may, when executed by processor 520, direct processor 520 to operate as described with respect to the various operational scenarios, sequences, and processes illustrated herein. For example, software 535 may include program instructions for calibration current sensing circuitry 515 as described herein.

In particular, the program instructions may include various components or modules that cooperate or otherwise interact to carry out the various processes and operational scenarios described herein. The various components or modules may be embodied in compiled or interpreted instructions, or in some other variation or combination of instructions. The various components or modules may be executed in a synchronous or asynchronous manner, serially or in parallel, in a single threaded environment or multi-threaded, or in accordance with any other suitable execution paradigm, variation, or combination thereof. Software 535 may include additional processes, programs, or components, such as operating system software, virtualization software, or other application software. Software 535 may also comprise firmware or some other form of machine-readable processing instructions executable by processor 520.

In general, software 535 may, when loaded into processor 520 and executed, transform a suitable apparatus, system, or device overall from a general-purpose computing system into a special-purpose computing system customized to provide current sensing calibration as described herein. Indeed, encoding software 535 on memory 530 may transform the physical structure of memory 530. The specific transformation of the physical structure may depend on various factors in different implementations of this description. Examples of such factors may include, but are not limited to, the technology used to implement the storage media of memory 530 and whether the computer-storage media are characterized as primary or secondary storage, as well as other factors.

For example, if the computer readable storage media are implemented as semiconductor-based memory, software 535 may transform the physical state of the semiconductor memory when the program instructions are encoded therein, such as by transforming the state of transistors, capacitors, or other discrete circuit elements constituting the semiconductor memory. A similar transformation may occur with respect to magnetic or optical media. Other transformations of physical media are possible without departing from the scope of the present description, with the foregoing examples provided only to facilitate the present discussion.

While some examples provided herein are described in the context of a microcontroller unit, circuitry, electrical components, or environments, the current sensing systems and methods described herein are not limited to such embodiments and may apply to a variety of other processes, systems, applications, devices, and the like. Aspects of the present invention may be embodied as a system, method, computer program product, and other configurable systems. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Unless the context clearly requires otherwise, throughout the description and the claims, the words "comprise," "comprising," and the like are inclusive meaning "including, but not limited to." In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A. A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The phrases "in some embodiments," "according to some embodiments," "in the embodiments shown," "in other embodiments," and the like generally mean the particular feature, structure, or characteristic following the phrase is included in at least one implementation of the present technology, and may be included in more than one implementation. In addition, such phrases do not necessarily refer to the same embodiments or different embodiments.

The above Detailed Description of examples of the technology is not intended to be exhaustive or to limit the technology to the precise form disclosed above. While specific examples for the technology are described above for illustrative purposes, various equivalent modifications are possible within the scope of the technology, as those skilled in the relevant art will recognize. For example, while processes or blocks are presented in a given order, alternative implementations may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed or implemented in parallel or may be performed at different times. Further any specific numbers noted herein are only examples: alternative implementations may employ differing values or ranges.

The teachings of the technology provided herein can be applied to other systems, not necessarily the system described above. The elements and acts of the various examples described above can be combined to provide further implementations of the technology. Some alternative implementations of the technology may include not only additional elements to those implementations noted above, but also may include fewer elements.

These and other changes can be made to the technology in light of the above Detailed Description. While the above description describes certain examples of the technology, and describes the best mode contemplated, no matter how detailed the above appears in text, the technology can be practiced in many ways. Details of the system may vary considerably in its specific implementation, while still being encompassed by the technology disclosed herein. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the above Detailed Description section explicitly defines such terms. Accordingly, the actual scope of the technology encompasses not only the disclosed examples, but also all equivalent ways of practicing or implementing the technology under the claims.

To reduce the number of claims, certain aspects of the technology are presented below in certain claim forms, but the applicant contemplates the various aspects of the technology in any number of claim forms. For example, while only one aspect of the technology is recited as a computer-readable medium claim, other aspects may likewise be embodied as a computer-readable medium claim, or in other forms, such as being embodied in a means-plus-function claim. Any claims intended to be treated under 35 U.S.C. § 112(f) will begin with the words "means for" but use of the term "for" in any other context is not intended to invoke treatment under 35 U.S.C. § 112(f). Accordingly, the applicant reserves the right to pursue additional claims after filing this application to pursue such additional claim forms, in either this application or in a continuing application.

What is claimed is:

1. A circuit device, comprising:
a controller, comprising:
a digital-to-analog converter;
a first amplifier comprising an input coupled to the digital-to-analog converter and an output;
a gain resistor network;
a second amplifier comprising a first input, a second input, and an output, the first input and the output each coupled to the gain resistor network; and
an analog-to-digital converter;
a first resistor coupled between the output of the first amplifier and the second input of the second amplifier;
a second resistor coupled to the second input of the second amplifier and configured to be coupled to a circuit having a current to be detected; and
a filter coupled between the output of the second amplifier and the analog-to-digital converter.

2. The circuit device of claim 1, wherein the controller further comprises a processor coupled to an output of the analog-to-digital converter.

3. The circuit device of claim 2, wherein the controller further comprises a temperature sensor configured to sense a temperature of the controller and provide an indication of the temperature to the processor.

4. The circuit device of claim 2, further comprising a temperature sensor coupled to the controller and configured to sense a temperature of the controller and provide an indication of the temperature to the processor.

5. The circuit device of claim 4, wherein the analog-to-digital converter is configured to provide indications of voltage detected at the output of the first amplifier, the output of the second amplifier, and an output of the gain resistor network.

6. The circuit device of claim 5, wherein the processor is configured to:
determine a first value of the current of the circuit based on the indications of voltage;
identify a temperature drift of the controller based on the indication of the temperature; and
determine, based on the temperature drift, a second value of the current by updating parameters of one or more of the first amplifier and the second amplifier.

7. The circuit device of claim 1, wherein the circuit having the current to be detected comprises a power source, a load coupled to the power source, and a resistor coupled to the load and to the second resistor.

8. A microcontroller unit (MCU), comprising:
a processor; and
current sensing circuitry coupled to the processor;
wherein the current sensing circuitry is configured to measure voltages associated with a load; and
wherein the processor is configured to:
obtain the measured voltages from the current sensing circuitry;
identify a temperature drift of the current sensing circuitry that exceeds a threshold value;
update parameters with which to determine a current associated with the load based on the temperature drift; and
determine the current associated with the load based on the updated parameters and the measured voltages.

9. The MCU of claim 8, wherein the current sensing circuitry comprises one or more operational amplifiers, one or more resistors, a digital-to-analog converter, an analog-to-digital converter, and a temperature sensor.

10. The MCU of claim 9, wherein the parameters comprise values associated with the one or more operational amplifiers and the one or more resistors, and wherein the updated parameters comprise updated values associated with the one or more operational amplifiers and the one or more resistors.

11. The MCU of claim 9, wherein to obtain the measured voltages from the current sensing circuitry, the processor is configured to obtain representations of the measured voltages from the analog-to-digital converter of the current sensing circuitry.

12. The MCU of claim 9, wherein the temperature drift is indicative of a temperature increase from a first temperature of the current sensing circuitry to a second temperature of the current sensing circuitry greater than the first temperature.

13. The MCU of claim 12, wherein the temperature sensor is configured to determine an amount of the temperature drift by identifying the first temperature at a first time, identifying the second temperature at a second time, and comparing the first and the second temperature.

14. The MCU of claim 13, wherein the temperature sensor is further configured to compare the amount of the temperature drift to the threshold value, and based on the amount exceeding the threshold value, provide an indication to the processor that the temperature drift exceeds the threshold value.

15. A method, comprising:
identifying a temperature drift of current sensing circuitry;
measuring voltages associated with a load by the current sensing circuitry;
obtaining the measured voltages from the current sensing circuitry;
updating parameters with which to determine a current associated with the load based on the temperature drift; and
determining the current associated with the load based on the updated parameters and the measured voltages.

16. The method of claim 15, wherein the current sensing circuitry comprises one or more operational amplifiers, one or more resistors, a digital-to-analog converter, an analog-to-digital converter, and a temperature sensor.

17. The method of claim 16, wherein the parameters comprise values associated with the one or more operational amplifiers and the one or more resistors, and wherein the updated parameters comprise updated values associated with the one or more operational amplifiers and the one or more resistors.

18. The method of claim 16, wherein obtaining the measured voltages from the current sensing circuitry comprises obtaining representations of the measured voltages from the analog-to-digital converter of the current sensing circuitry.

19. The method of claim 16, wherein the temperature drift is indicative of a temperature increase from a first temperature of the current sensing circuitry to a second temperature of the current sensing circuitry greater than the first temperature.

20. The method of claim 19, wherein identifying the temperature drift of the current sensing circuitry comprises, via the temperature sensor, determining an amount of the temperature increase by identifying the first temperature at a first time, identifying the second temperature at a second time, and comparing the first and second temperature.

* * * * *